United States Patent
Ito

(10) Patent No.: US 7,757,188 B2
(45) Date of Patent: Jul. 13, 2010

(54) METHOD AND APPARATUS FOR DESIGNING INTEGRATED CIRCUIT

(75) Inventor: Noriyuki Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 661 days.

(21) Appl. No.: 11/785,430

(22) Filed: Apr. 17, 2007

(65) Prior Publication Data
US 2008/0086711 A1 Apr. 10, 2008

(30) Foreign Application Priority Data
Oct. 4, 2006 (JP) .............................. 2006-272452

(51) Int. Cl.
G06F 17/50 (2006.01)
(52) U.S. Cl. .................. 716/1; 716/7; 716/12
(58) Field of Classification Search ................. 716/1–2, 716/7–12
See application file for complete search history.

(56) References Cited

U.S. PATENT DOCUMENTS 6,766,503 B2 * 7/2004 Fitzhenry et al. ............. 716/12

2001/0018756 A1 * 8/2001 Chang et al. ................. 716/1

FOREIGN PATENT DOCUMENTS

| JP | 06-342456 | 12/1994 |
|---|---|---|
| JP | 08-129576 | 5/1996 |
| JP | 2001-142915 | 5/2001 |
| JP | 2003-316843 | 11/2003 |

* cited by examiner

*Primary Examiner*—Paul Dinh
(74) *Attorney, Agent, or Firm*—Staas & Halsey LLP

(57) ABSTRACT

In the present invention, a block level net list is separated from a chip level net list so that the chip level net list can be created in a form in which a block is transparent to a designer. The present invention determines a destination block for circuit elements that are described in a chip level net list and for which the destination block is not determined, and creates a final net list by reflecting the chip level net list to the block level net list based on the information on the destination block. As a net list can be created in a form in which a block is transparent to a designer for a circuit system that is required to be optimized for the entire chip, the circuit system can be efficiently optimized.

11 Claims, 19 Drawing Sheets

FIG.2

```
Placement block_A;
  ff i0(5,5);
  ff i1(6,5);
  ff i2(7,5);
  ff i3(8,5);
  ff i4(25,45);
  ff i5(26,45);
  ff i6(27,45);
  ff i7(28,45);
end;

Placement block_B;
  ff i0(5,5);
  ff i1(6,5);
  ff i2(7,5);
  ff i3(8,5);
  ff i4(25,5);
  ff i5(26,5);
  ff i6(27,5);
  ff i7(28,5);
end;

Placement block_C;
  ff i0(12,20);
  ff i1(13,20);
  ff i2(14,20);
  ff i3(15,20);
  ff i4(2,25);
  ff i5(3,25);
  ff i6(4,25);
  ff i7(5,25);
end;

Placement block_D;
  ff i0(15,5);
  ff i1(15,6);
  ff i2(15,7);
  ff i3(15,8);
  ff i4(15,30);
  ff i5(15,31);
  ff i6(15,32);
  ff i7(15,33);
end;
```

FIG.3

```
module block_A (ck1, ck2, · · ·);
  input ck1, ck2, · · ·;
  output · · ·;

ff i0(.ck(ck1), · · ·);
  ff i1(.ck(ck1), · · ·);
  ff i2(.ck(ck1), · · ·);
  ff i3(.ck(ck1), · · ·);
  ff i4(.ck(ck2), · · ·);
  ff i5(.ck(ck2), · · ·);
  ff i6(.ck(ck2), · · ·);
  ff i7(.ck(ck2), · · ·);
endmodule module block_B (ck1, ck2, · · ·);
  input ck1, ck2, · · ·;
  output · · ·;

ff i0(.ck(ck1), · · ·);
  ff i1(.ck(ck1), · · ·);
  ff i2(.ck(ck1), · · ·);
  ff i3(.ck(ck1), · · ·);
  ff i4(.ck(ck2), · · ·);
  ff i5(.ck(ck2), · · ·);
  ff i6(.ck(ck2), · · ·);
  ff i7(.ck(ck2), · · ·);
endmodule module block_C (ck1, ck2, · · ·);
  input ck1, ck2, · · ·;
  output · · ·;

ff i0(.ck(ck1), · · ·);
  ff i1(.ck(ck1), · · ·);
  ff i2(.ck(ck1), · · ·);
  ff i3(.ck(ck1), · · ·);
  ff i4(.ck(ck2), · · ·);
  ff i5(.ck(ck2), · · ·);
  ff i6(.ck(ck2), · · ·);
  ff i7(.ck(ck2), · · ·);
endmodule module block_D (ck1, ck2, · · ·);
  input ck1, ck2, · · ·;
  output · · ·;

ff i0(.ck(ck1), · · ·);
  ff i1(.ck(ck1), · · ·);
  ff i2(.ck(ck1), · · ·);
  ff i3(.ck(ck1), · · ·);
  ff i4(.ck(ck2), · · ·);
  ff i5(.ck(ck2), · · ·);
  ff i6(.ck(ck2), · · ·);
  ff i7(.ck(ck2), · · ·);
endmodule
```

FIG. 4

```
module chip (ck, · · ·);
  input ck, · · ·;
  output · · ·;

wire w1;
  wire w2_A, w3_A, w4_A;
  wire w2_B, w3_B, w4_B;
  wire w2_C, w3_C, w4_C;
  wire w2_D, w3_D, w4_D;                      ⎤ #a buf1 i0(.in(ck), .x(w1));                   ] #b buf2 i1_A(.in(w1), .x(w2_A));
  buf3 i2_A(.in(w2_A), .x(w3_A));             ⎤ #c
  buf3 i3_A(.in(w2_A), .x(w4_A));

buf2 i1_B(.in(w1), .x(w2_B));
  buf3 i2_B(.in(w2_B), .x(w3_B));             ⎤ #d
  buf3 i3_B(.in(w2_B), .x(w4_B));

buf2 i1_C(.in(w1), .x(w2_C));
  buf3 i2_C(.in(w2_C), .x(w3_C));             ⎤ #e
  buf3 i3_C(.in(w2_C), .x(w4_C));

buf2 i1_D(.in(w1), .x(w2_D));
  buf3 i2_D(.in(w2_D), .x(w3_D));             ⎤ #f
  buf3 i3_D(.in(w2_D), .x(w4_D));

block_A i1(.ck1(w3_A), .ck2(w4_A), · · ·);
  block_B i2(.ck1(w3_B), .ck2(w4_B), · · ·);  ⎤ #g
  block_C i3(.ck1(w3_C), .ck2(w4_C), · · ·);
  block_D i4(.ck1(w3_D), .ck2(w4_D), · · ·);
endmodule       ↑              ↑
                └──────┬───────┘
                       │
INPUT PIN ALLOCATED BY INPUT PIN ALLOCATING UNIT
```

FIG.5

```
Placement chip;
  buf1 i0(50,50);                    —— #a buf2 i1_A(25,70);
  buf3 i2_A(15,60);
  buf3 i3_A(35,80);

buf2 i1_B(25,30);
  buf3 i2_B(15,20);
  buf3 i3_B(35,20);

buf2 i1_C(75,70);
  buf3 i2_C(85,75);
  buf3 i3_C(80,85);

buf2 i1_D(75,30);
  buf3 i2_D(85,10);
  buf3 i3_D(85,35);

block_A i1(5,40);
  block_B i2(5,5);
  block_C i3(70,65);
  block_D i4(70,5);
end;
```

FIG.6

```
module chip (ck, · · · );
 input ck, · · · ;
 output · · · ;

wire w1;

block_A i1(.@from_chip@w1(w1), .@from_chip@ck(ck), .@from_chip@1@w1(w1), · · · );  ⎤
 block_B i2(.@from_chip@w1(w1), · · · );                                              │
 block_C i3(.@from_chip@w1(w1), · · · );                                              ⎬ #a
 block_D i4(.@from_chip@w1(w1), · · · );                                              │
endmodule                                                                             ⎦ module block_A (@from_chip@w1, @from_chip@ck, @from_chip@1@w1, · · · );
 input @from_chip@w1, @from_chip@ck, · · · ;
 output @from_chip@1@w1, · · · ;

wire @from_chip@w2_A, ck1, ck2;

buf1 @from_chip@i0(.in(@from_chip@ck), .x(@from_chip@1@w1));

buf2 @from_chip@i1_A(.in(@from_chip@w1), .x(@from_chip@w2_A));  ⎤
 buf3 @from_chip@i2_A(.in(@from_chip@w2_A), .x(ck1));            ⎬ #b-1
 buf3 @from_chip@i3_A(.in(@from_chip@w2_A), .x(ck2));            ⎦ ff i0(.ck(ck1), · · · );
 ff i1(.ck(ck1), · · · );
 ff i2(.ck(ck1), · · · );
 ff i3(.ck(ck1), · · · );
 ff i4(.ck(ck2), · · · );
 ff i5(.ck(ck2), · · · );
 ff i6(.ck(ck2), · · · );
 ff i7(.ck(ck2), · · · );
endmodule
```

FIG.7

```
module block_B (@from_chip@w1, · · · );
  input @from_chip@w1, · · · ;
  output · · · ;

wire @from_chip@w2_B, ck1, ck2;

buf2 @from_chip@i1_B(.in(@from_chip@w1), .x(@from_chip@w2_B));  ⎤
  buf3 @from_chip@i2_B(.in(@from_chip@w2_B), .x(ck1));            ⎬ #b-2
  buf3 @from_chip@i3_B(.in(@from_chip@w2_B), .x(ck2));            ⎦ ff i0(.ck(ck1), · · · );
  ff i1(.ck(ck1), · · · );
  ff i2(.ck(ck1), · · · );
  ff i3(.ck(ck1), · · · );
  ff i4(.ck(ck2), · · · );
  ff i5(.ck(ck2), · · · );
  ff i6(.ck(ck2), · · · );
  ff i7(.ck(ck2), · · · );
endmodule module block_C (@from_chip@w1, · · · );
  input @from_chip@w1, · · · ;
  output · · · ;

wire @from_chip@w2_C, ck1, ck2;

buf2 @from_chip@i1_C(.in(@from_chip@w1), .x(@from_chip@w2_C));  ⎤
  buf3 @from_chip@i2_C(.in(@from_chip@w2_C), .x(ck1));            ⎬ #b-3
  buf3 @from_chip@i3_C(.in(@from_chip@w2_C), .x(ck1));            ⎦ ff i0(.ck(ck1), · · · );
  ff i1(.ck(ck1), · · · );
  ff i2(.ck(ck1), · · · );
  ff i3(.ck(ck1), · · · );
  ff i4(.ck(ck2), · · · );
  ff i5(.ck(ck2), · · · );
  ff i6(.ck(ck2), · · · );
  ff i7(.ck(ck2), · · · );
endmodule
```

FIG.8

```
module block_D (@from_chip@w1, · · · );
  input @from_chip@w1, · · · ;
  output · · · ;

wire @from_chip@w2_D, ck1, ck2;

buf2 @from_chip@i1_D(.in(@from_chip@w1), .x(@from_chip@w2_D));
  buf3 @from_chip@i2_D(.in(@from_chip@w2_D), .x(ck1));         ⎤ #b-4
  buf3 @from_chip@i3_D(.in(@from_chip@w2_D), .x(ck2));         ⎦ ff i0(.ck(ck1), · · · );
  ff i1(.ck(ck1), · · · );
  ff i2(.ck(ck1), · · · );
  ff i3(.ck(ck1), · · · );
  ff i4(.ck(ck2), · · · );
  ff i5(.ck(ck2), · · · );
  ff i6(.ck(ck2), · · · );
  ff i7(.ck(ck2), · · · );
endmodule
```

FIG.9

```
Placement chip;
  block_A i1(5,40);
  block_B i2(5,5);
  block_C i3(70,65);
  block_D i4(70,5);
end;

Placement block_A;
  buf1 @from_chip@i0(45,10);

buf2 @from_chip@i1_A(20,30);
  buf3 @from_chip@i2_A(10,20);
  buf3 @from_chip@i3_A(30,40);

ff i0(5,5);
  ff i1(6,5);
  ff i2(7,5);
  ff i3(8,5);
  ff i4(25,45);
  ff i5(26,45);
  ff i6(27,45);
  ff i7(28,45);
end;

Placement block_B;
  buf2 @from_chip@i1_B(20,25);
  buf3 @from_chip@i2_B(10,15);
  buf3 @from_chip@i3_B(30,15);

ff i0(5,5);
  ff i1(6,5);
  ff i2(7,5);
  ff i3(8,5);
  ff i4(25,5);
  ff i5(26,5);
  ff i6(27,5);
  ff i7(28,5);
end;

Placement block_C;
  buf2 @from_chip@i1_C(5,5);
  buf3 @from_chip@i2_C(15,10);
  buf3 @from_chip@i3_C(10,20);

ff i0(12,20);
  ff i1(13,20);
  ff i2(14,20);
  ff i3(15,20);
  ff i4(2,25);
  ff i5(3,25);
  ff i6(4,25);
  ff i7(5,25);
end;

Placement block_D;
  buf2 @from_chip@i1_D(5,25);
  buf3 @from_chip@i2_D(10,10);
  buf3 @from_chip@i3_D(10,40);

ff i0(15,5);
  ff i1(15,6);
  ff i2(15,7);
  ff i3(15,8);
  ff i4(15,30);
  ff i5(15,31);
  ff i6(15,32);
  ff i7(15,33);
end;
```

FIG.10

```
For (i= a marked net in a chip level net list ) {
While (process by a stage of gate until depth-first-search ends) {
If (three conditions below are established:
   · Is an instance name of the gate the same as the instance name found in the same search processing
     for the net list of a shadow?
   · Is the net name connected to an input/output pin of the gate the same?
   · Is an instance and a pin forming a net name connected to the input/output pin of the gate the same?
   then {continue depth-first-search}
   else {message that the net lists do not match, and process ends}
}
}
```

FIG.15

```
module chip (ck, · · ·);
  input ck, · · ·;
  output · · ·;

wire w1;

block_D i0(.ck1(ck), .ck2(w1), ck3(w1), · · ·);
  block_A i1(.ck(w1), · · ·);
  block_B i1(.ck(w1), · · ·);
  block_C i1(.ck(w1), · · ·);
endmodule                                              }#a module block_A (ck, · · ·);
  input ck, · · ·;
  output · · ·;

wire w1, w2, w3;

buf2 i0(.in(ck), .x(w1));
  buf3 i1(.in(w1), .x(w2));
  buf3 i2(.in(w1), .x(w3));
  ff i0(.ck(w2), · · ·);
  ff i1(.ck(w2), · · ·);
  ff i2(.ck(w2), · · ·);                               }#b
  ff i3(.ck(w2), · · ·);
  ff i4(.ck(w3), · · ·);
  ff i5(.ck(w3), · · ·);
  ff i6(.ck(w3), · · ·);
  ff i7(.ck(w3), · · ·);
endmodule
```

FIG.16

```
module block_B (ck, · · ·);
  input ck, · · ·;
  output · · ·;

wire w1, w2, w3;

buf2 i0(.in(ck), .x(w1));
  buf3 i1(.in(w1), .x(w2));
  buf3 i2(.in(w1), .x(w3));
  ff i0(.ck(w2), · · ·);
  ff i1(.ck(w2), · · ·);
  ff i2(.ck(w2), · · ·);
  ff i3(.ck(w2), · · ·);
  ff i4(.ck(w3), · · ·);
  ff i5(.ck(w3), · · ·);
  ff i6(.ck(w3), · · ·);
  ff i7(.ck(w3), · · ·);
endmodule
```
⎫
⎬ #c
⎭

```
module block_C (ck, · · ·);
  input ck, · · ·;
  output · · ·;

wire w1, w2, w3;

buf2 i0(.in(ck), .x(w1));
  buf3 i1(.in(w1), .x(w2));
  buf3 i2(.in(w1), .x(w3));
  ff i0(.ck(w2), · · ·);
  ff i1(.ck(w2), · · ·);
  ff i2(.ck(w2), · · ·);
  ff i3(.ck(w2), · · ·);
  ff i4(.ck(w3), · · ·);
  ff i5(.ck(w3), · · ·);
  ff i6(.ck(w3), · · ·);
  ff i7(.ck(w3), · · ·);
endmodule
```
⎫
⎬ #d
⎭

FIG.17

```
module block_D (ck1, ck2, ck3, · · · );
  input ck1, ck2, · · · ;
  output ck3, · · · ;

wire w1, w2, w3;

buf1 i0(.in(ck1), .x(ck3));  ←——— buffer p buf2 i1(.in(ck2), .x(w1));
  buf3 i2(.in(w1), .x(w2));
  buf3 i3(.in(w1), .x(w3));
  ff i0(.ck(w2), · · · );
  ff i1(.ck(w2), · · · );
  ff i2(.ck(w2), · · · );
  ff i3(.ck(w2), · · · );
  ff i4(.ck(w3), · · · );
  ff i5(.ck(w3), · · · );
  ff i6(.ck(w3), · · · );
  ff i7(.ck(w3), · · · );
endmodule
```
e

METHOD AND APPARATUS FOR DESIGNING INTEGRATED CIRCUIT

CROSS-REFERENCE TO RELATED APPLICATIONS

This application claims the conventional priority based on Japanese Application No. 2006-272452, filed on Oct. 4, 2006, the disclosures of which are incorporated herein by reference.

BACKGROUND OF THE INVENTION

1. Field of the Invention

The present invention generally relates to a method and apparatus for designing an integrated circuit that design a circuit by dividing an integrated circuit into a plurality of blocks. Specifically, the present invention relates to a method and apparatus for designing an integrated circuit that allow efficient optimization of a circuit system that requires to be optimized across the entire integrated circuit and also allow efficient design of an integrated circuit.

2. Description of the Related Art

In an integrated circuit increased in scale year after year, generally, hierarchical designing is adopted in designing such an integrated circuit. In the hierarchical designing, an integrated circuit is divided into some blocks and the blocks are independently designed in parallel so that a large integrated circuit can be efficiently designed.

The hierarchical designing has some problems, which includes designing of a clock distribution circuit. In the clock distribution circuit, it is ideal to optimize the distribution system in the entire integrated circuit. In the conventional hierarchical designing, however, even such a clock distribution circuit is divided for each block to design a circuit.

Next, circuit designing of a clock distribution circuit performed in conventional hierarchical designing will be described in detail with reference to FIGS. 14 to 18.

When an integrated circuit is hierarchically designed, the integrated circuit is first logically designed only for logical connection between circuit elements such as a flip-flop, a latch, and a buffer by using a block as a unit, and then the integrated circuit is physically designed for specific arrangement of the circuit elements and blocks.

FIG. 14 shows an example of a clock distribution circuit that is logically designed according to hierarchical designing. In the example, it is assumed that the clock distribution circuit is logically designed by dividing an integrated circuit into four logical blocks of a logical block A, a logical block B, a logical block C and a logical block D and a clock buffer p that forms the clock distribution circuit is arranged in the logical block D. Here, a heavy line in the figure indicates logical wiring for connecting between the logical blocks.

FIGS. 15, 16, and 17 show data of net lists of the clock distribution circuit that is logically designed here.

In the net list, in the part #a of FIG. 15, it is defined that a chip of the integrated circuit has a pin ck and inputs a clock ck, that the logical block D has the pin ck1 for inputting a clock ck, the pin ck2 for outputting a signal w1, the pin ck3 for inputting the signal w1, that a logical block A has the pin ck for inputting the signal w1, that a logical block B has the pin ck for inputting the signal w1 and that a logical block C has the pin ck for inputting the signal w1 to define connection relationship between logical blocks arranged on the chip.

A part #b of FIG. 15 defines that a logical block A has the pin ck and inputs a clock ck, that a clock buffer buf2i0 shown in FIG. 14 outputs the signal w1 with the clock ck as an input, that a clock buffer buf3i1 shown in FIG. 14 outputs a signal w2 with the signal w1 as an input, and that a clock buffer buf3i2 shown in FIG. 14 outputs a signal w3 with the signal w1 as an input.

A part #b of FIG. 15 defines that a flip flop ffi0 (a flip flop at the leftmost in the left group) has the pin ck with the signal w2 as an input, that a flip flop ffi1 (a flip flop at the second place from left in the left group) has the pin ck with the signal w2 as an input, that a flip flop ffi2 (a flip flop at the third place from the left in the left group) has the pin ck with a signal w2 as an input, and that a flip flop ffi3 (a flip flop at the rightmost in the left group) has the pin ck with a signal w2 as an input.

A part #b of FIG. 15 defines that a flip fop ffi4 (a flip flop at the leftmost in the right group) has the pin ck with a signal w3 as an input, that a flip flop ffi5 (a flip flop at the second place from the left in the right group) has the pin ck with a signal w3 as an input, that a flip flop ffi6 (a flip flop at the third place from the left in the right group) has the pin ck with a signal w3 as an input, and that a flip flop ffi7 (a flip flop at the rightmost in the right group) has the pin ck with a signal w3 as an input.

A part #c of FIG. 16 defines the same thing as that in the part #b of FIG. 15 for the logical block B.

A part #d of FIG. 16 defines the same thing as that in the part #b of FIG. 15 for the logical block C.

A part #e of FIG. 17 defines that the logical block D has pins ck1, ck2, ck3 and outputs a clock ck3 with the clocks ck1, ck2 as inputs, and the same thing as that in the part #b of FIG. 15, and additionally, also defines that the clock buffer p denoted by bufli0 outputs a clock ck3 with the clock ck1 as an input.

When a designer of an integrated circuit designs a clock distribution circuit according to a hierarchical design, the designer first determines which clock circuit part is to be arranged in each block and performs logical designing with a block as a unit to create a net list of the clock distribution circuit with a block as a unit as shown in FIGS. 15 to 17. Then, the designer performs physical designing for specific arrangement of logical blocks or circuit elements as shown in FIG. 18. Here, a heavy line shown in the figure is a physical line for connecting physical blocks.

In such a manner, when an integrated circuit is divided into some blocks according to the hierarchical design to accomplish the design in the conventional technique, even a clock distribution circuit is divided for each block to design the circuit, although it would be ideal to optimize the distribution system in the clock distribution circuit across the entire integrated circuit.

In the patent documents 1 (Japanese Patent Laid-Open No. 2003-316843) and patent document 2 (Japanese Patent Laid-Open No. 8-129576) disclose techniques relating the present invention.

In the patent document 1, a technique for retrieving logic required to combine clocks from respective hierarchies, dividing the combined clock and returning the clocks to the hierarchies is described. In the patent document 2, a technique for performing clock-wiring by making each hierarchy in an expanded form and performing similar wiring by viewing the result in each hierarchy is described.

According to the conventional technique, however, there is a problem in that when an integrated circuit is divided into a plurality of blocks to accomplish the design, a circuit system such as a clock distribution circuit, which would ideally be optimized across the entire integrated circuit, cannot be efficiently optimized.

That is to say, there is a problem in that it is difficult to optimize the circuit system in consideration of skew (a difference between clock reaching times) viewed from all over the circuit when the clock distribution circuit is divided to accomplish design as in a conventional technique.

As such, a circuit system such as a clock distribution circuit, which would ideally be optimized across the entire integrated circuit, needs to be designed without being divided into blocks. However, in the conventional technique, it is difficult to optimize the circuit system across the entire integrated circuit because such a circuit system is also divided into blocks to accomplish the design.

According to the conventional technique, there is also a problem in that an integrated circuit cannot be efficiently designed when an integrated circuit is divided into a plurality of blocks to accomplish the design.

That is to say, it may be found that although the clock buffer p is in the logical D block when logical designing is performed, the clock buffer p needs to be in another physical block when physical designing is performed as shown in FIG. 14. For example, it may be found that the clock buffer p needs to be in the physical block A as shown in FIG. 19.

In such a case, the circuit needs logical correction so that the clock buffer p is in the logical block A even in logical designing.

As such, according to the conventional technique, there is also a problem in that when an integrated circuit is divided into a plurality of blocks to accomplish the design, a change made due to a physical design requirement may involve logical correction, and therefore an integrated circuit cannot be efficiently designed.

SUMMARY OF THE INVENTION

It is an object of the present invention to provide a method for designing an integrated circuit for allowing efficient optimization of a circuit system that needs to be optimized across the entire of the integrated circuit and also allowing efficient design of the integrated circuit when an integrated circuit is divided into a plurality of blocks to accomplish the design.

It is another object of the present invention to provide an apparatus for designing an integrated circuit for allowing efficient optimization of a circuit system that needs to be optimized across the entire of the integrated circuit and also allowing efficient design of the integrated circuit when an integrated circuit is divided into a plurality of blocks to accomplish the design.

The method for designing an integrated circuit of the present invention is the method for designing an integrated circuit that designs an integrated circuit by dividing the integrated circuit into a plurality of blocks. The method comprises creating a block level net list by grouping circuit elements belonging to the same block for the circuit elements to be designed at the block level and assigning an input pin to the grouped circuit elements, creating a chip level net list for the circuit elements to be designed at the chip level and the input pin, while clarifying a circuit element whose destination block can be determined among the circuit elements to be designed at the chip level, determining a destination block for a circuit element whose destination block cannot be determined among the circuit elements to be designed at the chip level, and creating a final block level net list by reflecting the chip level net list on the block level net list based on information on the determined destination block, while adding a keyword indicating that a component name owned by the net list part to be reflected is generated from the chip level net list to the component name in reflecting the chip level net list on the block level net list.

The apparatus for designing an integrated circuit of the present invention is the apparatus for designing an integrated circuit that designs an integrated circuit by dividing the integrated circuit into a plurality of blocks. The apparatus comprises a block level net list creating unit creating a block level net list by grouping circuit elements belonging to the same block for the circuit elements to be designed at the block level and assigning an input pin to the grouped circuit elements, a chip level net list creating unit creating a chip level net list for circuit elements to be designed at the chip level and the input pin, while clarifying a circuit element whose destination block can be determined among the circuit elements to be designed at the chip level, a destination block determining unit determining a destination block for a circuit element whose destination block cannot be determined among the circuit elements to be designed at the chip level, and a final net list creating unit creating a final block level net list by reflecting the chip level net list on the block level net list based on information on the determined destination block, while adding a keyword indicating that a component name owned by the net list part to be reflected is generated from the chip level net list to the component name in reflecting the chip level net list on the block level net list.

The present invention enables a designer of an integrated circuit to efficiently optimize a circuit system such as a clock distribution circuit that is required to be optimized for the entire chip by enabling the designer to create a net list in a form in which a block is transparent to the designer for the circuit system.

Additionally, the present invention enables the designer to create a new final net list by changing the destination block for the circuit elements whose destination block described in the chip level net list without changing the block level net list and the chip level net list. Therefore, a change made due to a physical design requirement does not involve logical correction so that an integrated circuit can be efficiently designed.

BRIEF DESCRIPTION OF THE DRAWINGS

FIG. 2 is a diagram showing an example of arrangement data of a storage element created by a storage element arranging unit.

FIG. 3 is a diagram showing an example of allocation data of an input pin created by an input pin allocating unit.

FIG. 4 is a diagram showing an example of a net list created by a net list creating unit.

FIG. 5 is a diagram showing an example of arrangement data of a clock buffer created by a clock buffer arranging unit.

FIGS. 6, 7 and 8 are diagrams showing an example of a net list created by a final net list creating unit.

FIG. 9 is a diagram showing an example of layout data created by a layout data creating unit.

FIG. 10 is a processing flow executed by a checking unit.

FIGS. 15, 16 and 17 are schematic diagrams of a net list of a clock distribution circuit created in a conventional technique.

DETAILED DESCRIPTION OF THE PREFERRED EMBODIMENTS

Figure 1:
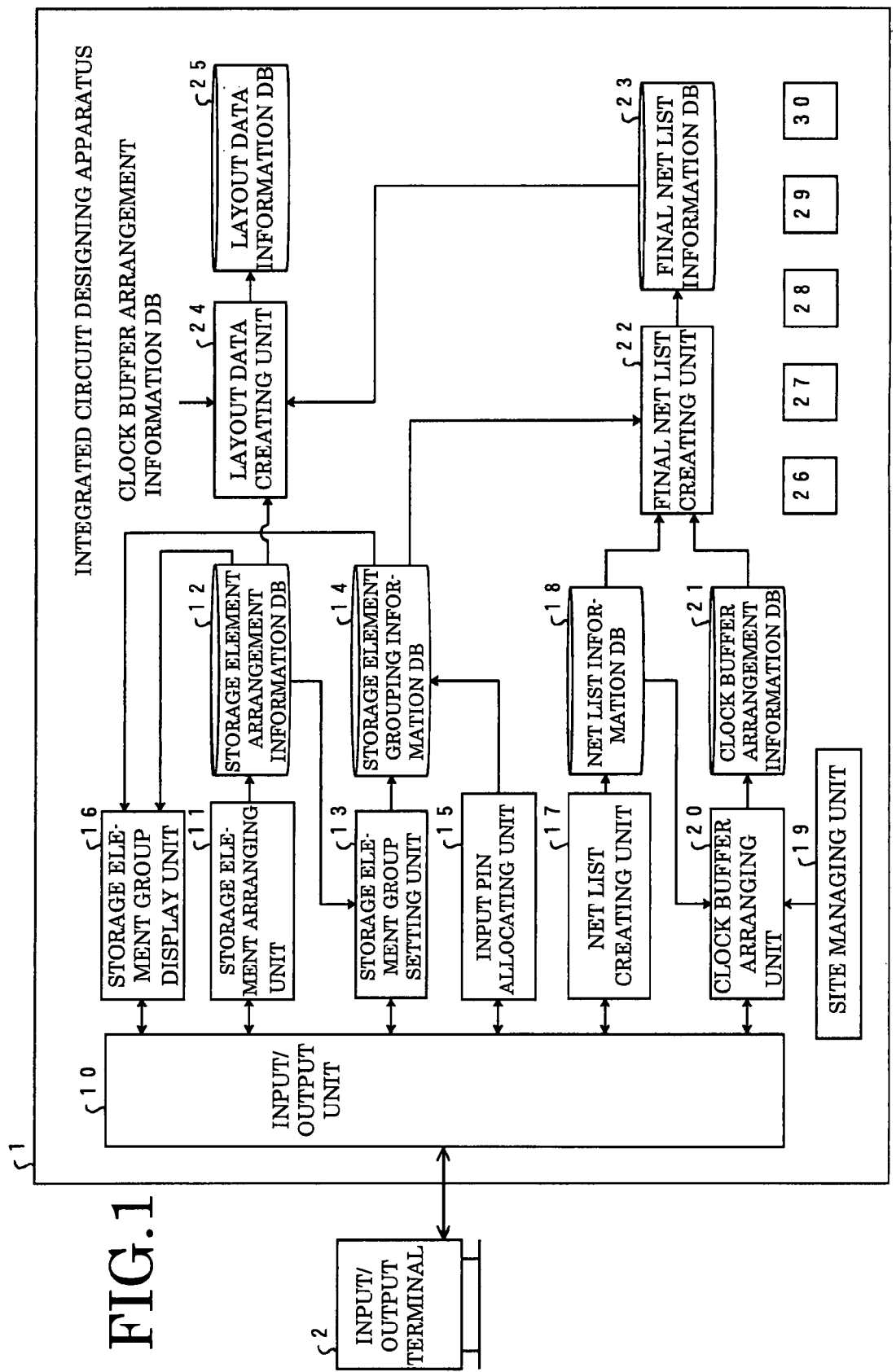
FIG. 1 is an embodiment of an integrated circuit designing apparatus of the present invention.

Hereinafter, an outline of the present invention is described. The apparatus for designing an integrated circuit of the present invention designs an integrated circuit by dividing the integrated circuit into a plurality of blocks. The apparatus includes (1) a block level net list creating unit creating a block level net list by grouping circuit elements belonging to the same block for the circuit elements to be designed at the block level and assigning an input pin to the grouped circuit elements, (2) a chip level net list creating unit creating a chip level net list for circuit elements to be designed at the chip level and the input pin, while clarifying a circuit whose destination block can be determined among the circuit elements to be designed at the chip level, (3) a destination block determining unit determining a destination block for a circuit element whose destination block cannot be determined among the circuit elements to be designed at the chip level, and (4) a final net list creating unit creating a final block level net list by reflecting the chip level net list created by the chip level net list creating unit on the block level net list created by the block level net list creating unit based on information on the destination block determined by the destination block determining unit, while adding a keyword indicating that a component name owned by the net list part to be reflected is generated from the chip level net list to the component name in reflecting the chip level net list on the block level net list.

Preferably, the apparatus further includes (5) a block level location determining unit determining a location of the circuit elements to be designed at the block level on a block, (6) a chip level location determining unit determining a location of the circuit element to be designed at the chip level on a chip, and (7) a circuit element location determining unit creating final information on a location on the block for circuit elements by reflecting information on the location of the circuit elements on the chip on information on the location of the circuit elements on the block, while using a component name added with the keyword as a component name of the circuit elements on which the information on the location of the circuit elements on the chip is reflected in reflecting the information on the location of the circuit elements on the chip on the information on the location of the circuit elements on the block.

Preferably, the apparatus further includes (8) a chip level correction addressing unit deleting, when a chip level net list is corrected after the net list added with a keyword is created, a net list part added with a keyword from the net list added with a keyword and substituting the net list part added with a keyword created based on the corrected chip level net list for the deleted net list part, (9) a block level correction addressing unit deleting, when the net list added with a keyword is corrected, the keyword from the net list in the corrected part, deleting a net list part corresponding to the corrected part included in the chip level net list, and substituting the net list part from which the keyword is deleted for the deleted net list part, and (10) a determination unit determining whether a net list part added with the keyword included in the net list added with the keyword matches the chip level net list or not.

Each of the above-described processing unit can be realized by a computer program. The computer program realizes the present invention as the program is provided on an appropriate computer readable recording medium or over a network, and installed and operating on controlling unit such as a CPU to implement the present invention.

The apparatus for designing an integrated circuit of the present invention with above-described configuration firstly designs a circuit at the block level by interaction with a designer of the integrated circuit. Namely, the apparatus creates a block level net list by grouping circuit elements belonging to the same block for the circuit elements to be designed at the block level and assigning an input pin to the grouped circuit elements.

Next, the apparatus determines a location of the circuit elements to be designed at the block level on a block.

The apparatus designs the circuit at the chip level by interacting with a designer of the integrated circuit. Namely, the apparatus creates a chip level net list for circuit elements to be designed at the chip level and the input pin, while clarifying a circuit element whose destination block can be determined among the circuit elements to be designed at the chip level.

Subsequently, the apparatus determines a location of the circuit element to be designed at the chip level on a chip. Here, when the location on the chip to be determined is in a region in which arrangement of the circuit elements is not allowed, the apparatus determines the location by moving the circuit elements into a region in which arrangement of the circuit elements is allowed and which is closest to the location on the chip.

Next, the apparatus determines a destination block for a circuit element whose destination block cannot be determined among the circuit elements to be designed at the chip level. The apparatus may determine the destination block by identifying a block in which the circuit element to be placed based on the location on a chip determined for the circuit element.

Next, the apparatus creates a final block level net list by reflecting the chip level net list on the block level net list based on information on the determined destination block for the circuit element whose destination block cannot be determined among the circuit elements to be designed at the chip level. Here, the apparatus adds a keyword indicating that a component name owned by the net list part to be reflected is generated from the chip level net list to the component name in reflecting the chip level net list on the block level net list.

Finally, the apparatus creates final information on a location on the block for circuit elements by reflecting information on the location of the circuit elements on the chip for the circuit elements to be designed at the chip level on information on the location of the circuit elements on the block for the circuit elements to be designed at the block level, while using a component name added with the keyword as a component name of the circuit elements on which the information on the location of the circuit elements on the chip is reflected in reflecting the information on the location of the circuit elements on the chip on the information on the location of the circuit elements on the block.

In this manner, the apparatus for designing an integrated circuit of the present invention creates the final block level net list by separating the block level net list from the chip level net list so that the chip level net list can be created in a form in which a block is transparent to the designer and reflecting the created chip level net list on the block level net list based on information on the destination block when the destination block for the circuit element, which is on the chip level net list, and, for which the destination block is not determined, is determined.

With the above-described configuration, the apparatus of the present invention enables a designer of an integrated circuit to efficiently optimize a circuit system by enabling the designer to create a net list in a form in which a block is transparent to the designer for such a circuit system as a clock distribution circuit that requires to be optimized for the entire chip.

Additionally, the apparatus of the present invention enables the designer to create a new final net list by changing the destination block for the circuit elements which is on the chip level net list and for which the destination block is not determined without changing the block level net list and the chip level net list. Therefore, a change made due to a physical design requirement does not involve logical correction so that an integrated circuit can be efficiently designed.

In the apparatus of the present invention, such a thing as the chip level net list may be corrected after the net list added with a keyword is created occurs. That interferes in keeping consistency.

When a chip level net list is corrected after the net list added with a keyword is created, the apparatus of the present invention deletes a net list part added with a keyword from the net list added with a keyword and substitutes the net list part added with a keyword created based on the corrected chip level net list for the deleted net list part.

Furthermore, in the apparatus of the present invention, the net list added with a keyword may be corrected. That interferes in keeping consistency.

When the net list added with a keyword is corrected, the apparatus of the present invention deletes the keyword from the net list in the corrected part, deletes a net list part corresponding to the corrected part included in the chip level net list, and substitutes the net list part from which the keyword is deleted for the deleted net list part.

In the apparatus of the present invention, the chip level net list may be corrected or the net list added with a keyword may be corrected after the net list added with a keyword is created. A designer of an integrated circuit may forget to activate processing for keeping consistency of the net list in such a case.

The apparatus of the present invention has a function determining whether the net list part added with the keyword included in the net list added with the keyword matches a chip level net list or not.

The present invention will be described in detail according to embodiments below.

FIG. 1 shows an embodiment of an integrated circuit designing apparatus 1 for designing a clock distribution system. The integrated circuit apparatus 1 is the apparatus for designing an integrated circuit of the present invention.

For simplicity of description, the embodiment to be described below omits description on a function for wiring a net between clock buffers or wiring a net between circuit elements.

As shown in FIG. 1, the integrated circuit designing apparatus 1 is connected to an input/output terminal 2 for a designer of a clock distribution circuit to operate on. The integrated circuit designing apparatus 1 includes an input/output unit 10 for executing input/output processing with the input/output terminal 2, a storage element arranging unit 11, a storage element arrangement information database 12, a storage element group setting unit 13, a storage element grouping information database 14, an input pin allocating unit 15, a storage element group display unit 16, a net list creating unit 17, a net list information database 18, a site managing unit 19, a clock buffer arranging unit 20, a clock buffer arrangement information database 21, a final net list creating unit 22, a final net list information database 23, a layout data creating unit 24, a layout data information database 25, a checking unit 26, a first deleting unit 27, a second deleting unit 28, a first substituting unit 29 and a second substituting unit 30.

The clock distribution system defined at the chip level of an integrated circuit supplies clocks supplied from an input of a chip to storage elements such as a flip-flop, a latch or a RAM via several stages of clock buffers for synchronizing by a clock.

When the chip is hierarchically designed, the storage elements are in the respective divided blocks. In such a case, a clock input is generally created at an entrance to each block, from which the clock distribution circuit is entered into a block to distribute clocks to the storage elements. Then, at the chip level, a net list for a circuit that distributes clocks from a clock input of a chip to a clock input of each block.

Essentially, however, for the clock distribution system, it is more efficient in optimizing or arranging and wiring to create a net list of a circuit which distributes clocks to storage elements for the entire chip and perform arrangement of clock buffer in the net list and wiring of the clock nets.

The integrated circuit designing apparatus 1 of the embodiment realizes the abovementioned things with a configuration to be described below.

[1] Processing of the Storage Element Arranging Unit 11

The storage element arranging unit 11 is for processing at the block level. The unit 11 arranges storage elements such as a latch in each block by interaction with a designer of the clock distribution circuit to store the arrangement data in the storage element arrangement information database 12.

FIG. 2 shows an example of arrangement data for storage elements created by the storage element arranging unit 11.

Figure 14:
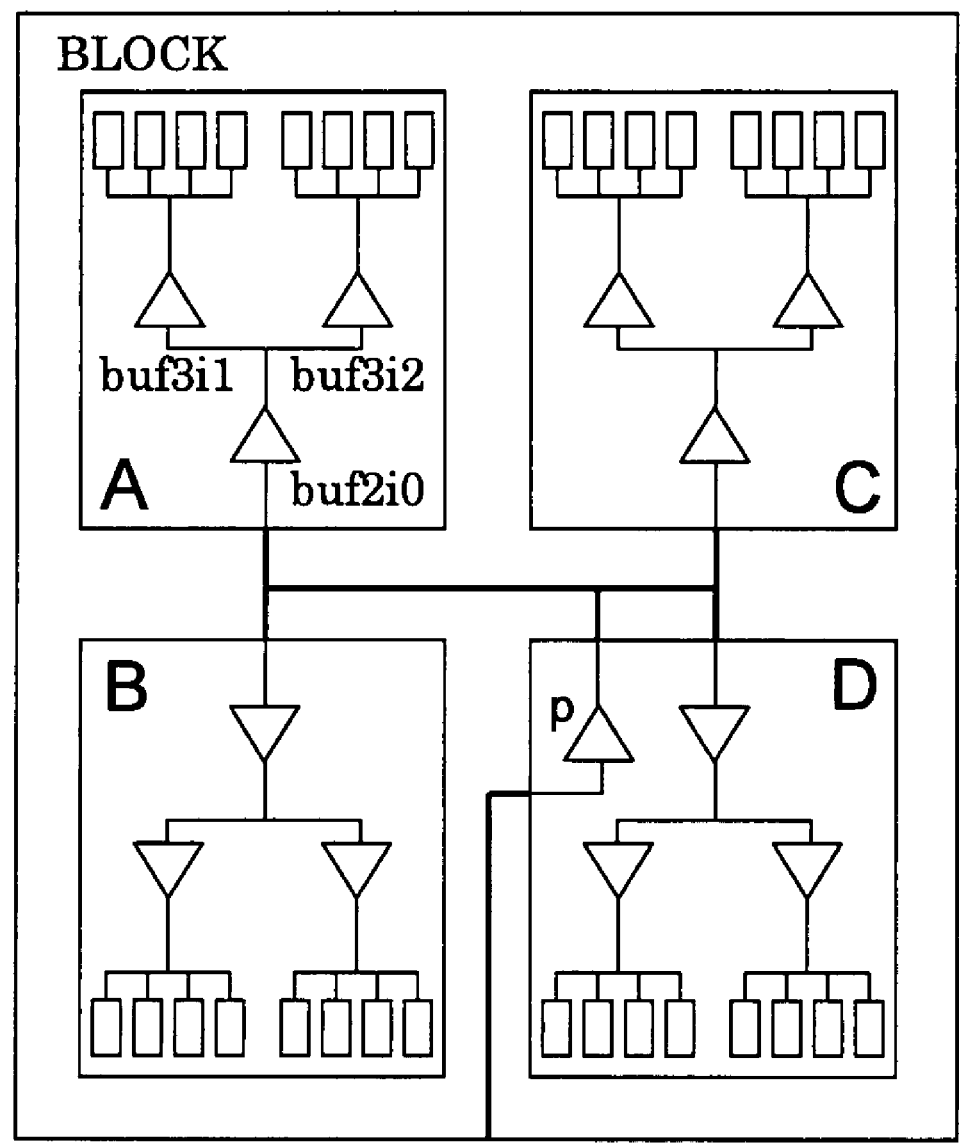
FIG. 14 is a schematic diagram of a logically designed clock distribution circuit.
Figure 18:
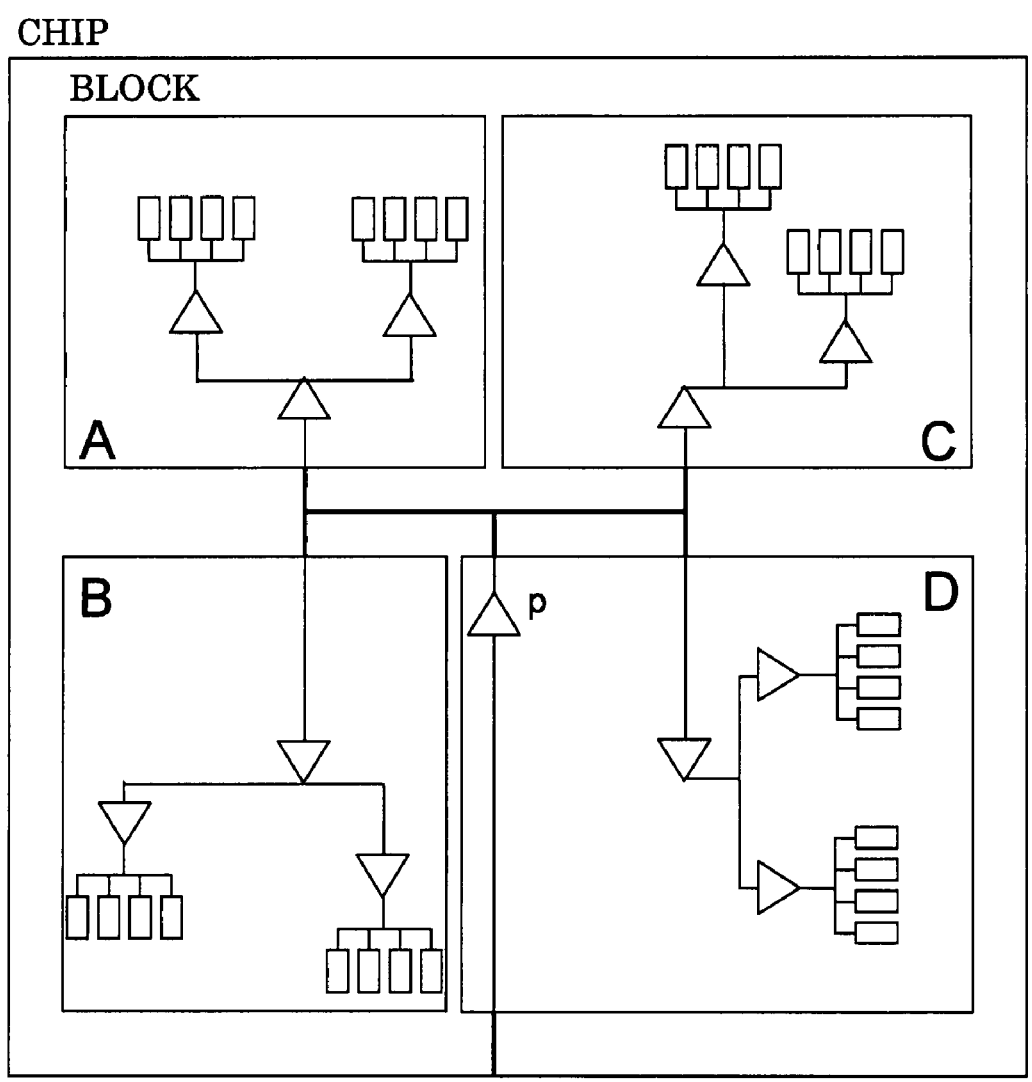
FIG. 18 is a schematic diagram of a physically designed clock distribution circuit.

It is assumed that the arrangement data is for arranging the storage elements described in a logical circuit shown in FIG. 14. In the arrangement data, a location of each storage element is represented on a local coordinate system for each block.

[2] Processing of the Storage Element Group Setting Unit 13

The storage element group setting unit 13 is for performing processing at the block level. The unit 13 groups storage elements for receiving clocks supplied from the same final stage clock buffer in each block as shown below, and stores the grouping information in the storage element grouping information database 14.

Group 1: storage element number 1, ...
Group 2: storage element number n, ...

To describe the processing by storage elements described in the arrangement data of FIG. 2, the storage element group setting unit 13 sets ffi0 to ffi3 in the block A as a group and ffi4 to ffi7 in the block A as a group, for example. The storage element group setting unit 13 sets ffi0 to fi3 in the block B as a group and ffi4 to ffi7 in the block B as a group. The storage element group setting unit 13 sets ffi0 to ffi3 in the block C as a group and ffi4 to ffi7 in the block C as a group. The storage element group setting unit 13 sets ffi0 to ffi3 in the block D as a group and ffi4 to ffi7 in the block D as a group.

The reason for performing this grouping is that grouping over different blocks in verilog (language for describing a net list) causes such a problem in that description of a net list becomes complicated.

Grouping information may be given in a form of a file from outside.

[3] Processing of the Input Pin Allocating Unit 15

The input pin allocating unit 15 is for performing processing at the block level. The unit 15 allocates an input pin to each storage element group set by the storage element group setting unit 13 and stores the allocated data in the storage element grouping information database 14.

FIG. 3 shows an example of the allocated data of an input pin created by the input pin allocating unit 15.

As shown in FIG. 3, the input pin allocating unit 15 allocates an input pin ck1 for inputting a clock ck to ffi0 to ffi3 in the block A which is set as a group, and allocates an input pin ck2 for inputting a clock ck to ffi4 to ffi7 in the block A which is set as a group, for example.

The input pin allocating unit 15 allocates the input pin ck1 for inputting the clock ck to ffi0 to ffi3 in the block B that are set as a group and allocates the input pin ck2 for inputting the clock ck to ffi4 to ffi7 in the block B that are set as a group, for example.

The input pin allocating unit 15 allocates the input pin ck1 for inputting the clock ck to ffi0 to ffi3 in the block C that are set as a group, and allocates the input pin ck2 for inputting the clock ck to ffi4 to ffi7 in the block C that are set as a group, for example.

The input pin allocating unit 15 allocates the input pin ck1 for inputting the clock ck to ffi0 to ffi3 in the block D that are set as a group, and allocates the input pin ck2 for inputting the clock ck to ffi4 to ffi7 in the block D that are set as a group, for example.

According to processing of the input pin allocating unit 15, a block level net list is created as shown in FIG. 3.

[4] Processing of the Storage Element Group Display Unit 16

The storage element group display unit 16 draws a location of each storage element group set by the storage element group setting unit 13 and a frame indicating the group (a minimum rectangular frame enclosing storage elements in a group) on a display screen and also draws an input pin allocated by the input pin allocating unit 15 at the frame position when the storage element group display unit displays each block on a display screen according to the chip level.

[5] Processing of the Net List Creating Unit 17

The net list creating unit 17 is for processing at the chip level. The net list creating unit 17 designs a chip level net list for defining connection between a clock buffer defined in a form that does not belong to a block, a clock buffer defined in a form that is arranged in a block, and an input pin allocated by the input pin allocating unit 15 (it is defined which block the input pin is arranged in) by interaction with a designer of the clock distribution circuit by using drawing data displayed on the storage element group display unit 16, and stores the net list in the net list information database 18.

Thus, the net list creating unit 17 designs a net list of the clock distribution circuit described at the chip level and stores the net list in the net list information database 18.

FIG. 4 shows an example of a net list created by the net list creating unit 17 based on the allocation data of an input pin shown in FIG. 3.

In the net list shown in FIG. 4, the part #a defines that a chip has the pin ck and inputs a clock cd and that w1, w2_A, w3_A, w4_A, w2_B, w3_B, w4_B, w2_C, w3_C, w4_C, w2_D, w3_D, and w4_D are used as a signal.

The part #b defines that there are a clock buffer bufli0 to output a signal w1 by using the clock ck as an input as clock buffers that are defined in a form not belonging to a block.

The part #c defines that there are a clock buffer buf2$i1$_A to output a signal w2_A by using the signal w1 as an input, a clock buffer buf3$i2$_A to output a signal w3_A by using a signal w2_A as an input, and a clock buffer buf3$i3$_A to output a signal w4_A by using a signal w2_A as an input as clock buffers to be arranged in the block A.

The part #d defines that there are a clock buffer buf2$i1$_B to output a signal w2_B by using the signal w1 as an input, a clock buffer buf3$i2$_B to output a signal w3_B by using a signal w2_B as an input, and a clock buffer buf3$i3$_B to output a signal w4_B by using a signal w2_B as an input as clock buffers to be arranged in the block B.

The part #e defines that there are a clock buffer buf2$i1$_C to output a signal w2_C by using the signal w1 as an input, a clock buffer buf3$i2$_C to output a signal w3_C by using a signal w2_C as an input, and a clock buffer buf3$i3$_C to output a signal w4_C by using a signal w2_C as an input as clock buffers to be arranged in the block C.

The part #f defines that there are a clock buffer buf2$i1$_D to output a signal w2_D by using the signal w1 as an input, a clock buffer buf3$i2$_D to output a signal w3_D by using a signal w2_D as an input, and a clock buffer buf3$i3$_D to output a signal w4_D by using a signal w2_D as an input as clock buffers to be arranged in the block D.

The part #g defines that the block A has the pin ck1 to input the signal w3_A (the input pin ck1 allocated by the input pin allocating unit 15) and the pin ck2 to input the signal w4_A (the input in ck2 allocated by the input pin allocating unit 15). The part also defines that the block B has the pin ck1 to input the signal w3_B (the input pin ck1 allocated by the input pin allocating unit 15) and the pin ck2 to input the signal w4_B (an input pin ck2 allocated by the input pin allocating unit 15). The part also defines that the block C has the pin ck1 to input the signal w3_C (the input pin ck1 allocated by the input pin allocating unit 15), the pin ck2 for inputting the signal w4_C (an input pin ck2 allocated by the input pin allocating unit 15). The part also defines that the block D has the pin ck1 to input the signal w3_D (the input pin ck1 allocated by the input pin allocating unit 15) and the pin ck2 to input the signal w4_D (the input pin ck2 allocated by the input pin allocating unit 15).

In such a manner, the storage element arranging unit 11, the storage element group setting unit 13 and the input pin allocating unit 15 for processing at the block level do not deal with a clock buffer that requires to optimize in the entire chip and the net list creating unit 17 for processing at the chip level first deals with such a clock buffer.

In such a manner, the net list creating unit 17 designs a chip level net list for defining connection between a clock buffer defined in a form that does not belong to a block, a clock buffer defined in a form that is arranged in a block and an input pin allocated by the input pin allocating unit 15 by interaction with a designer of the clock distribution circuit by using drawing data displayed by the storage element group displaying unit 16, and stores the net list in the net list information database 18.

[6] Processing of the Clock Buffer Arranging Unit 20

The clock buffer arranging unit 20 is for processing at the chip level. The unit 20 has clock buffers defined in the net list created by the net list creating unit 17 as objects of processing, determines optimal locations of the clock buffers on the chip and also determines a location of each block on the chip by interacting with a designer of the clock distribution circuit and stores the arrangement data in the clock buffer arrangement information database 21.

In determining the locations, the clock buffer arranging unit 20 determines whether a location of a clock buffer designated by the designer of the clock distribution circuit is in a region in which arrangement is allowed or not by referring to management data of the site managing unit 19 that manages information on a region (site) in which arrangement is allowed on a chip. When the location is in the region in which arrangement is not allowed, the clock buffer arranging unit 20 determines the location by moving the location of the clock buffer in a site that is in the place closest to the location of the clock buffer and in which arrangement is allowed.

With this function, the designer of the clock distribution circuit can determine the location of a clock buffer on a chip without thinking about the site.

FIG. 5 shows an example of arrangement data of a clock buffer created by the clock buffer arranging unit 20.

In the arrangement data, a location of each clock buffer and a location of each block are represented on a global coordinate system on a chip.

Figure 19:
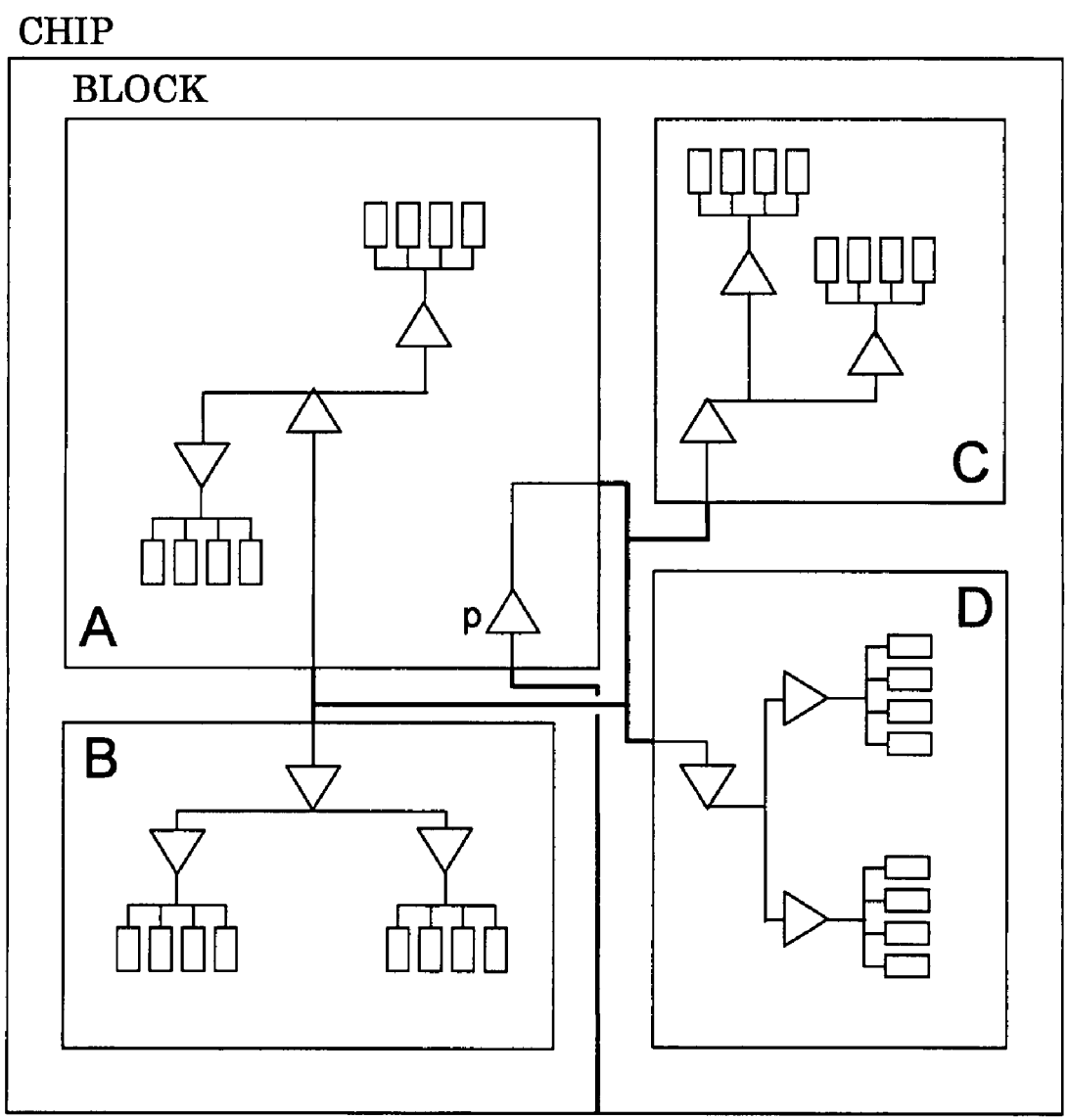
FIG. 19 is a schematic diagram of a clock distribution circuit for describing a problem in a conventional technique.

According to processing of the clock buffer arranging unit 20 and the abovementioned processing of the storage element arranging unit 11, the locations are designed for the clock distribution circuit as shown in FIG. 19.

As mentioned above, the net list creating unit 17 creates a net list by defining a clock buffer in a form that does not belong to a block (clock buffer bfii0 shown in FIG. 4) in creating the net list of a clock distribution circuit. As shown in part #a of FIG. 5, the location of a clock buffer in a form that does not belong to the block is determined and accordingly which block the clock buffer belongs to is determined at this stage, according to the processing by the clock buffer arranging unit 20.

[7] Processing of the Final Net List Creating Unit 22

As it is determined which block the clock buffer defined in a form that does not belong to a block finally belongs according to processing of the clock buffer arranging unit 20, the final net list creating unit 22 automatically creates the final net list of the clock distribution circuit (a net list for which that all the clock buffers belong to any of the blocks is defined) based on the determination and the net list created by the net list creating unit 17, and stores the final net list in the final net list information database 23.

The final net list is created by dropping a shadow of the net list of the clock distribution circuit at the chip level on each block. That is performed by reflecting (projecting) net list information that is not described at the block level from the chip level to the block level.

The final net list creating unit 22 determines clock buffers defined at the chip level and a net between the block buffers as a part whose shadows to be dropped on respective blocks according to a criterion such that a clock buffer arranged over a block according to the processing of the clock buffer arranging unit 20 drops a shadow on the block there.

The final net list creating unit 22 creates a copy of verilog at another position for the determined part, adds a particular keyword (for example, @from-chip@) indicating that it is a shadow at a top of an instance name or a net name of a cell to make it apparent that it is a shadow. The net name of a shadow connected to an input pin at a block boundary added with a keyword indicating that the net name is converted into a pin name is used as the input pin name at a block boundary.

When pluralities of cells with the same function are used, the instance name of the cell is for identifying the fact. For describing the fact by buf3*i*2_A, buf3 is a cell name and i2_A is the instance name.

FIGS. 6 to 8 show examples of the net list created by the final net list creating unit 22.

The part #a of FIG. 6 defines pins included in the blocks A, B, C and D. The net list creating unit 17 determines that a clock buffer defined in a form that does not belong to a block finally belongs to the block A. Thus, as it is apparent from FIG. 19, it is defined that the block A has three pins (pins provided for a block boundary part) according to a shadow from the chip level net list. On the contrary, as it is apparent from FIG. 19, it is defined that the blocks B, C and D have a pin (pin provided for a boundary part in a block) according to the shadow from the chip level net list as the blocks B, C and D are not influenced by clock buffers defined in a form that do not belong to a block by the net list creating unit 17.

As shown in part #b-1 of FIG. 6, the net list creating unit 17 determines that clock buffers defined in a form that do not belong to a block finally belong to the block A. Thus, as it is apparent from FIG. 19, it is defined that the block A has four clock buffers according to the shadow from the chip level net list and that connection between them. On the contrary, as it is shown in parts #b-2, #b-3 of FIG. 7 and a part #b-4 of FIG. 8, it is defined that the blocks B, C and D have three clock buffers according to the shadow from the net list as the blocks B, C and D are not influenced from clock buffers defined in a form that do not belong to a block by the net list creating unit 17.

Processing executed by the final net list creating unit 22 is further described by using a net list part of the block B shown in FIG. 7 as a specific example. The pin ck1 is allocated to the block B with ffi0 to ffi3 being set as a group and the pin ck2 is allocated to the block B with ffi4 to ffi7 being set as a group and no clock buffer is present as shown in FIG. 3 according to processing of the storage element group setting unit 13 and the input pin allocating unit 15 that execute processing at the block level.

The final net list creating unit 22 determines that parts #a and #d of FIG. 4 describing clock buffers need to be dropped as a shadow based on the net list shown in FIG. 4 created by the net list creating unit 17 and drops the parts as a shadow added with "@from-chip@" that is a particular keyword indicating that it is a shadow as shown in the net list parts in the block B shown in FIG. 7.

The final net list created by the final net list creating unit 22 is the same as the block level net list created by logical designing of a conventional technique after all, except that "@from-chip@" that is a particular keyword indicating that it is a shadow is added to the parts.

The present invention is largely characterized in that, when the net list creating unit 17 defines a part of a clock buffer in a form that does not belong to a block and creates a chip level net list and the clock buffer arranging unit 20 determines an optimal location on the chip of the clock buffers, the final net list creating unit 22 automatically creates the final net list by incorporating the net list part for the clock buffers into the block level net list created by the input pin allocating unit 15 at the stage based on the determination.

With the configuration, the designer of the clock distribution circuit first determines to arrange a clock buffer in the block A, for example. However, when the designer finds that it is preferable to arrange the block buffer in the block B from a viewpoint of a skew, the designer can obtain a desired net list only by discarding the net list created by arranging the clock buffer in the block A, changing the arranged poison of the clock buffers to the block B and activating the final net list creating unit 22.

The final net list creating unit 22 specifically performs inner processing to be described below in order to actually put a net list of a shadow into each block.

Thus, the final net list creating unit 22 outputs the verilog net list and the layout data (cell arrangement information or wiring information) from data in each block (formed by a net list and layout data) in a textual form and merges the net list of a shadow with the outputted verilog net list. Then, the unit 22 performs inner processing of creating data of each block from the merged net list again and further writing the layout data outputted as text to the data.

[8] Processing of the Layout Data Creating Unit 24

When the final net list is created according to processing of the final net list creating unit 22, the layout data creating unit 24 creates layout data with which layout data of a shadow is merged by dropping the layout data of a shadow on the layout data of each block, and stores the layout data in the layout data information database 25.

Here, the layout data creating unit 24 processes to change the instance name and the net name of a clock buffer to the name corresponding to the name of the net list of a shadow and drop the name to a hierarchy below as the final net list creating unit 22 does.

FIG. 9 shows an example of layout data created by the layout data creating unit 24.

In the layout data, the locations of each storage element and each clock buffer and the location of each block are represented on a global coordinate system on a chip.

As shown in FIG. 9, the layout data creating unit 24 drops arrangement data of a clock buffer shown in FIG. 5 determined by the clock buffer arranging unit 20 to the arrangement data of the storage element shown in FIG. 2 created by the storage element arranging unit 11 with "@from-chip@" added.

According to processing of the layout data creating unit 24, the net list of a shadow and the layout data in a shadow are connected with each other (the connected data will be data of a block). That enables the designer of the clock distribution circuit to view designing information as real designing information in a block.

The layout data creating unit 24 specifically performs inner processing to be described below to actually put the layout in a shadow into each block.

That is, the layout data creating unit 24 once outputs the layout data from data in each block, merges the layout data of a shadow with the outputted layout data and reads the data in the block again.

[9] Processing of the Checking Unit 26

The checking unit 26 checks whether the chip level net list matches the net list part (net list part of a shadow) added with keywords that is merged to the block level net list or not.

The designer of the clock distribution circuit can change the chip level net list without regard of the net list part added with keywords that is merged with the block level net list, and also can change the net list part added with keywords that is merged with the block level net list without regard of the chip level net list. Thus, the integrated circuit designing apparatus 1 of the embodiment has checking unit 26 for checking whether there is no contradiction between the chip level net list and the net list part added with keywords that is merged to the block level net list or not.

FIG. 10 shows a processing flow executed by the checking unit 26.

A "marked net" described in the processing flow means a net associated with an input pin that is at a block boundary. In the processing flow, the net list parts in a block thereafter are compared with each other with the net being a starting point.

The checking unit 26 processes to check whether the chip level net list matches the net list part (net list part of a shadow) added with keywords that is merged with the block level net list or not by tracing back to compare the tree structures of the two net lists by using depth-first-search according to the processing flow shown in FIG. 10.

[10] Processing of the First Deleting Unit 27, the Second Deleting Unit 28, the First Substituting Unit 29 and the Second Substituting Unit 30

The first deleting unit 27 processes to delete the net list part with keywords from the net list added with keywords (net list of a shadow) with the net list added with keywords created by the final net list creating unit 22 as an object of deletion.

The second deleting unit 28 processes to delete the net list part associated with the net list part added with keywords from the net list with the net list (chip level net list) created by the net list creating unit 17 as an object of deletion.

The first substituting unit 29 processes to substitute a new net list part of a shadow created by the final net list creating unit 22 for the net list part deleted by the first deleting unit 27.

The second substituting unit 30 processes to delete keywords from the net list part added with keywords changed without regard of the net list created by the net list creating unit 17 and substitute the net list part in which keywords are deleted for the net list part deleted by the second deleting unit 28.

The reason why the integrated circuit designing apparatus 1 of the embodiment has the first deleting unit 27, the second deleting unit 28, the first substituting unit 29 and the second substitution unit 30 will be described below.

When the net list is corrected at the chip level, the correction needs to be reflected to the net list part added with keywords included in the block level net list (net list part of a shadow).

The reflecting processing is performed in the manner shown below. First, the verlog net list and the layout data are outputted from data in each block in a textual form. Then, the first deleting unit 27 deletes the net list of a shadow from the outputted net list. As keywords that can identify that it is a shadow are added to the instance name and the net name to the net list of a shadow, the part to which the keyword is added is recognized and deleted.

The state where the net list of a shadow is deleted is the same as the state before the shadow is dropped. Then, data of each block is created according to the abovementioned procedure. The first substituting unit 29 substitutes the net list that is corrected at the chip level for the net list part of a shadow of each block (deleted net list part).

In such a manner, the integrated circuit designing apparatus 1 can reflect the correction to the block level net list with the first deleting unit 27 and the first substituting unit 29, when the net list is corrected at the chip level.

As only keywords that can identify that they are shadow are added to the instance name or the net name in the net list of a shadow that is dropped to a block below, the form is the same as that of a usual verilog net list. Accordingly, the designer who designs blocks can correct the net list of a shadow to optimize the net list in a block.

For correcting a net list of a shadow for data in a block joint with the layout data, there are methods for correcting a net list of a shadow stored independent to the data in the block or for outputting a net list of a shadow in a verilog form once and correcting the net list. With either method, as the original copy of the net list of a shadow in a block is a chip level net list, the changed part of the net list of a shadow needs to be reflected to the original copy.

The reflection is performed in the manner below. First, a block including the net list in a corrected shadow is identified and an input pin at a boundary part included in the block is identified. That means that a net list part in the block after the input pin is corrected.

Next, a net list position in the original copy associated with the input pin is identified, and the second deleting unit 28 deletes the net list part after the identified net list position. Then, the second substituting unit 30 deletes keywords from the net list part in a block after the identified input pin and connects the net list part from which the keywords are deleted as a substitute for the net list part deleted by the second deleting unit 28.

When the net list of a shadow is corrected, the integrated circuit designing apparatus 1 can reflect the correction to the net list in the original copy with the second deleting unit 28 and the second substituting unit 30.

[11] Processing of Integrated Circuit Designing Apparatus 1

Figure 11:
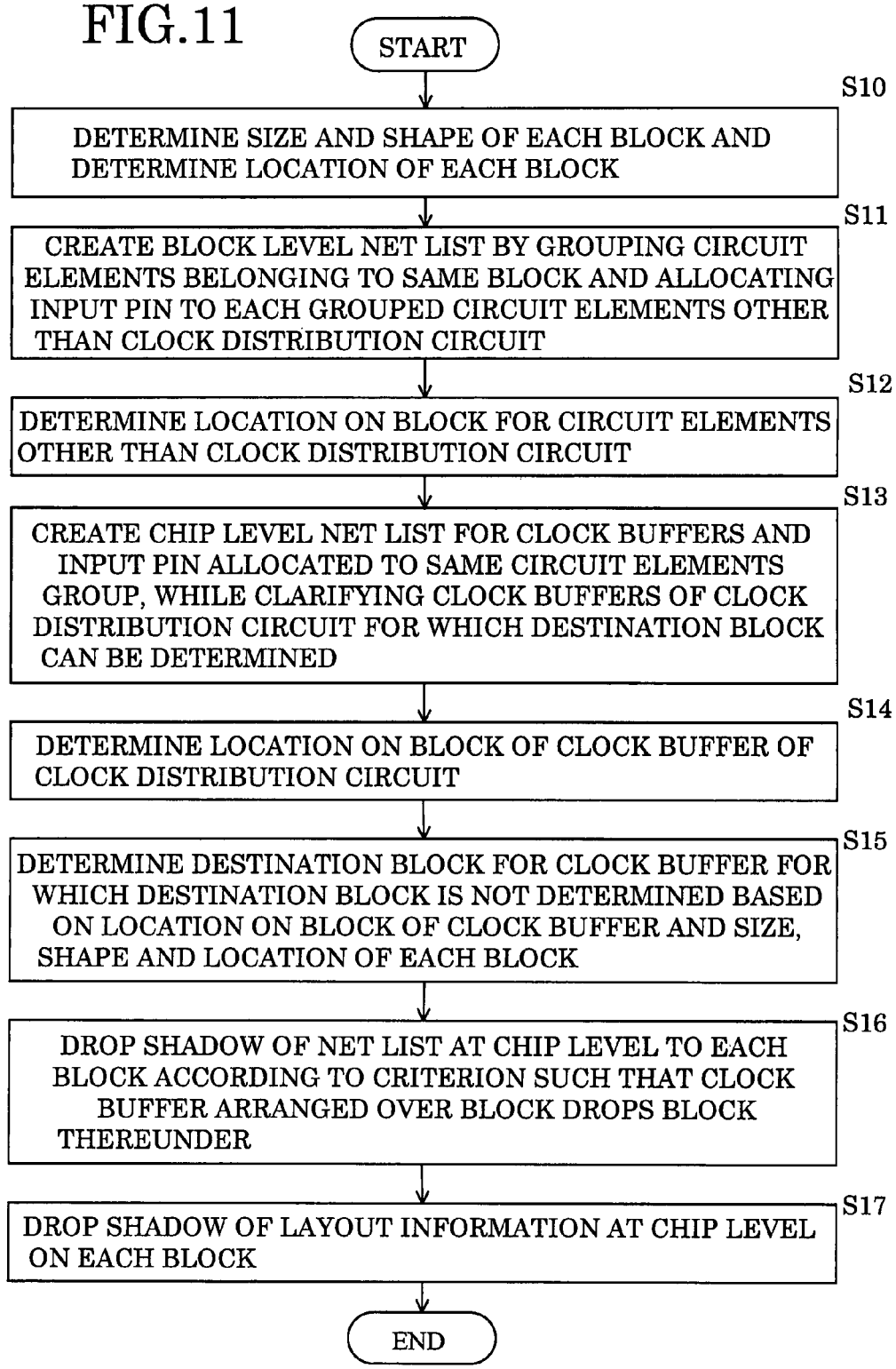
FIGS. 11, 12 and 13 are processing flows executed by the integrated circuit designing apparatus.
Figure 12:
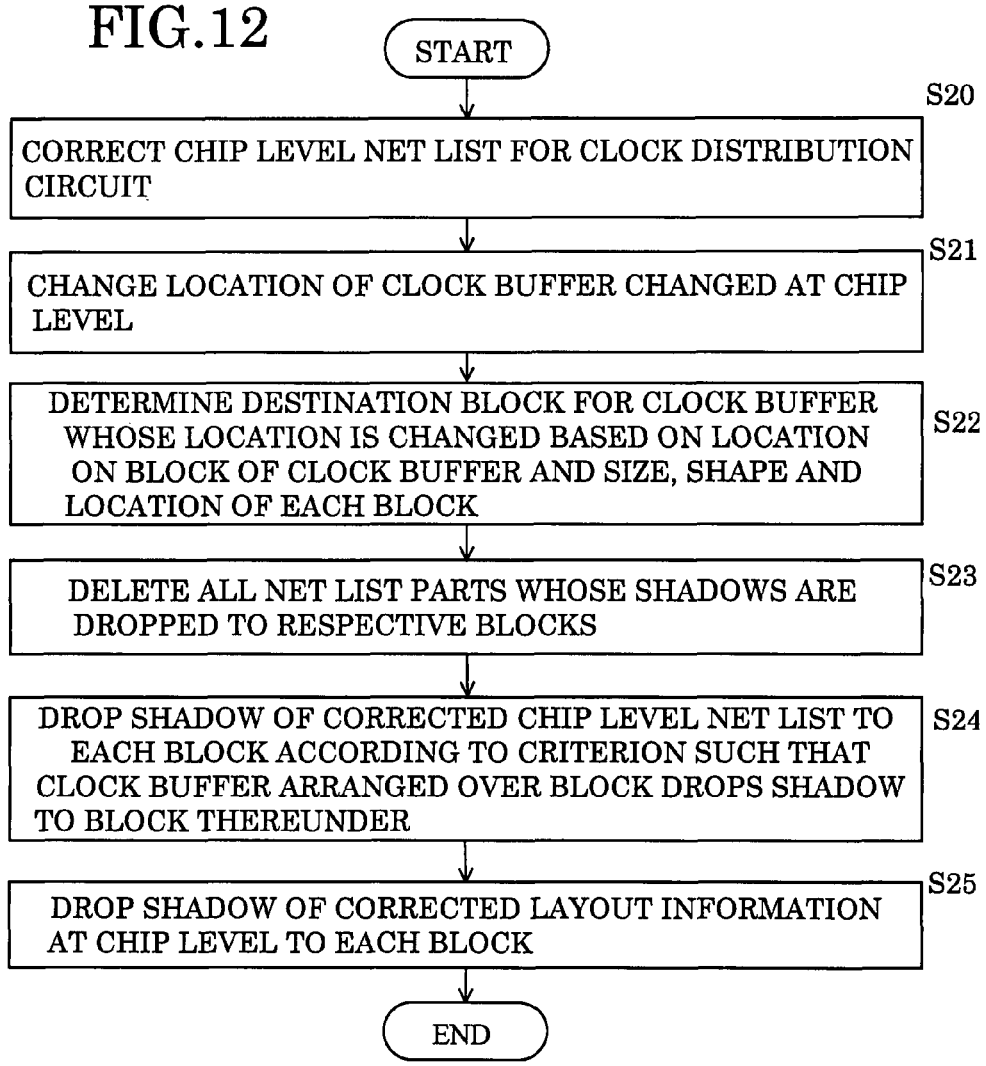
Figure 13:
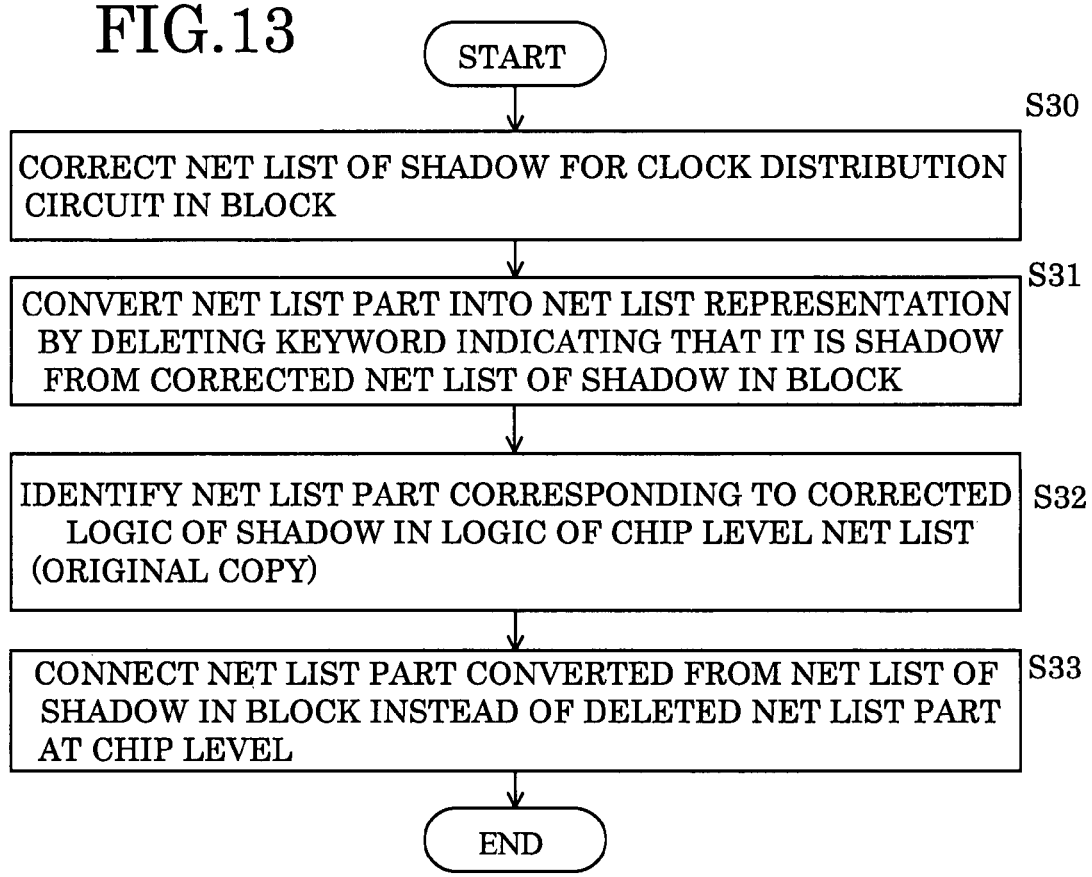

FIGS. 11, 12 and 13 show processing flows executed by the integrating circuit designing apparatus 1.

According to the processing flows, an example of processing executed by the integrated circuit designing apparatus 1 with the configuration of FIG. 1 will be described below.

When the integrated circuit designing apparatus 1 is activated in response to a request to design an integrated circuit, the integrated circuit designing apparatus 1 first determines the size and shape of each block into which the integrated circuit is divided and determines the location of each block by interacting with a designer of the integrated circuit at step S10 as shown in the processing flow of FIG. 11.

At step S11, by interacting with the designer of the integrated circuit, the integrated circuit designing apparatus 1 creates a block level net list by grouping circuit elements belonging to the same block and allocating an input pin to each of the grouped circuit elements other than the clock distribution circuit.

At step S12, by interacting with the designer of the integrated circuit, the integrated circuit designing apparatus 1 determines a location on a block for the circuit elements other than the clock distribution circuit.

At step S13, by interacting with the designer of the integrated circuit, the integrated circuit designing apparatus 1 creates a chip level net list for the clock buffers and an input pin allocated to the same circuit elements group, while clarifying the clock buffer of the clock distribution circuit for which a destination block can be determined.

At step S14, by interacting with the designer of the integrated circuit, the integrated circuit designing apparatus 1 determines a location on a block of the clock buffer of the clock distribution circuit.

At step S15, the integrated circuit designing apparatus 1 determines a destination block for the clock buffer for which a destination block is not determined, based on the size, shape and location of each block determined at the step S10 and the location on the block of the clock buffer determined at the step S14.

At step S16, the integrated circuit designing apparatus 1 drops a shadow of the chip level net list to each block according to a criterion such that a clock buffer arranged over a block drops a shadow on the block thereunder.

At step S17, the integrated circuit designing apparatus 1 drops a shadow of the layout information at the chip level to each block and ends the processing.

In such a manner, the integrated circuit designing apparatus 1 creates the net list shown in FIGS. 6 to 8 and the layout data shown in FIG. 9 as designing information of the integrated circuit.

Now, an example of processing executed by the integrated circuit designing apparatus 1 when the net list is corrected at the chip level will be described according to the processing flow of FIG. 12.

When the integrated circuit designing apparatus 1 is activated in response to a request to correct the chip level net list, the integrated circuit designing apparatus 1 first corrects the chip level net list for the clock distribution circuit by interacting with the designer of the integrated circuit at step S20 as shown in the processing flow of FIG. 12.

At step S21, by interacting with the designer of the integrated circuit, the integrated circuit designing apparatus 1 changes the location of the clock buffer changed at the chip level.

At step S22, the integrated circuit designing apparatus 1 determines the destination block for the clock buffer whose location is changed based on the size, shape and location of each block and the location on the block of the clock buffer changed at the step S21.

At step S23, the integrated circuit designing apparatus 1 deletes all the net list parts whose shadows are dropped to respective blocks.

At step S24, the integrated circuit designing apparatus 1 drops a shadow of the corrected chip level net list to each block according to a criterion such that a clock buffer arranged over a block drops a shadow to the block thereunder.

At step S25, the integrated circuit designing apparatus 1 drops a shadow of the corrected layout information at the chip level to each block and ends the processing.

In such a manner, when the net list is corrected at the chip level, the integrated circuit designing apparatus 1 reflects the correction to the block level net list.

According to the processing flow of FIG. 13, a processing executed by the integrated circuit designing apparatus 1 when the net list at a clock buffer arranged in the block is corrected will be described below.

When the integrated circuit designing apparatus 1 is activated in response to a request to correct the net list of the clock distribution circuit that is arranged in a block, the integrated circuit designing apparatus 1 first corrects the net list of a shadow for the clock distribution circuit in a block by interacting with a designer of an integrated circuit at step S30 as shown in the processing flow of FIG. 13.

At step S31, the integrated circuit designing apparatus 1 converts the net list part into a net list representation in the original copy by deleting the keyword indicating that it is a shadow from the corrected net list of a shadow in a block.

At step S32, the integrated circuit designing apparatus 1 identifies the net list part corresponding to logic of a shadow corrected at the step S30 in the logic of the chip level net list (original copy) and deletes the net list part.

At step S33, the integrated circuit designing apparatus 1 connects the net list part converted from the net list of a shadow in a block (net list part obtained by the deletion processing at the step S31) instead of the net list part at the chip level deleted at the step S32 and ends the processing.

In this manner, when the net list of a shadow is corrected, the integrated circuit designing apparatus 1 reflects the correction to the net list of the original copy.

The present invention can be applied to the case where an integrated circuit is divided into a plurality of blocks and the circuit is designed. The present invention enables efficient optimization for a circuit system required to be optimized in the entire integrated circuit.

What is claimed is:

1. A method for designing an integrated circuit that designs an integrated circuit by dividing the integrated circuit into a plurality of blocks in an integrated circuit designing apparatus, the method comprising:

creating at a block level net list creating unit a block level net list by grouping circuit elements belonging to the same block for the circuit elements to be designed at the block level and assigning an input pin to the grouped circuit elements;

creating at a chip level net list creating unit a chip level net list for the circuit elements to be designed at the chip level and the input pin, while clarifying a circuit element whose destination block can be determined among the circuit elements to be designed at the chip level;

determining at a destination block determining unit a destination block for a circuit element whose destination block cannot be determined among the circuit elements to be designed at the chip level; and creating at a final net list creating unit a final block level net list by reflecting the chip level net list on the block level net list based on information on the determined destination block, while adding a keyword indicating that a component name owned by the net list part to be reflected is generated from the chip level net list to the component name in reflecting the chip level net list on the block level net list.

2. The method according to claim 1, further comprising:
determining at a chip level location determining unit a location of the circuit elements to be designed at the chip level on a chip,
wherein, in determining the destination block, determining the destination block for the circuit elements whose destination block cannot be determined among circuit elements to be designed at the chip level based on the determined location on the chip.

3. The method according to claim 1, further comprising:
determining at a block level location determining unit a location of the circuit elements to be designed at the block level on a block;
determining at a chip level location determining unit a location of the circuit elements to be designed at the chip level on a chip; and
creating at a circuit element location determining unit final information on a location on the block for circuit elements by reflecting information on the location of the circuit elements on the chip on information on the location of the circuit elements on the block, while using a component name added with the keyword as a component name of the circuit elements on which the information on the location of the circuit elements on the chip is reflected in reflecting the information on the location of the circuit elements on the chip on the information on the location of the circuit elements on the block.

4. The method according to claim 2, wherein, in determining the location on the chip, when the location on the chip is in a region in which arrangement of the circuit elements is not allowed, determining the location by moving the circuit elements into a region in which arrangement of the circuit elements is allowed and which is closest to the location on the chip.

5. The method according to claim 3, wherein, in determining the location on the chip, when the location on the chip is in a region in which arrangement of the circuit elements is not allowed, determining the location by moving the circuit elements into a region in which arrangement of the circuit elements is allowed and which is closest to the location on the chip.

6. The method according to claim 1, further comprising:
deleting at a deleting unit, when a chip level net list is corrected after the net list added with a keyword is created, a net list part added with a keyword from the net list added with a keyword and substituting at a substituting unit the net list part added with a keyword created based on the corrected chip level net list for the deleted net list part.

7. The method according to claim 1, further comprising:
deleting at a deleting unit, when the net list added with a keyword is corrected, the keyword from the net list in the corrected part, deleting at the deleting unit a net list part corresponding to the corrected part included in the chip level net list, and substituting at a substituting unit the net list part from which the keyword is deleted for the deleted net list part.

8. The method according to claim 1, further comprising:
determining at a checking unit whether a net list part added with the keyword included in the net list added with the keyword matches the chip level net list or not.

9. An apparatus for designing an integrated circuit by dividing the integrated circuit into a plurality of blocks, the apparatus comprising:
a block level net list creating unit creating a block level net list by grouping circuit elements belonging to the same block for the circuit elements to be designed at the block level and assigning an input pin to the grouped circuit elements;
a chip level net list creating unit creating a chip level net list for circuit elements to be designed at the chip level and the input pin, while clarifying a circuit element whose destination block can be determined among the circuit elements to be designed at the chip level;
a destination block determining unit determining a destination block for a circuit element whose destination block cannot be determined among the circuit elements to be designed at the chip level; and
a final net list creating unit creating a final block level net list by reflecting the chip level net list on the block level net list based on information on the determined destination block, while adding a keyword indicating that a component name owned by the net list part to be reflected is generated from the chip level net list to the component name in reflecting the chip level net list on the block level net list.

10. The apparatus according to claim 9, further comprising:
a chip level location determining unit determining a location of the circuit elements to be designed at the chip level on a chip,
wherein the destination block determination unit determines the destination block for the circuit elements whose destination block cannot be determined among circuit elements to be designed at the chip level based on the determined location on the chip.

11. The apparatus according to claim 9, further comprising:
a block level location determining unit determining a location of the circuit elements to be designed at the block level on a block;
a chip level location determining unit determining a location of the circuit elements to be designed at the chip level on a chip; and
a circuit element location determining unit creating final information on a location on the block for circuit elements by reflecting information on the location of the circuit elements on the chip on information on the location of the circuit elements on the block, while using a component name added with the keyword as a component name of the circuit elements on which the information on the location of the circuit elements on the chip is reflected in reflecting the information on the location of the circuit elements on the chip on the information on the location of the circuit elements on the block.

* * * * *